United States Patent [19]
Kumagai

[11] Patent Number: 5,188,136
[45] Date of Patent: Feb. 23, 1993

[54] CLEANING DEVICE

[75] Inventor: Yoshio Kumagai, Kofu, Japan

[73] Assignee: Tokyo Electron Limited, Tokyo, Japan

[21] Appl. No.: 792,917

[22] Filed: Nov. 15, 1991

[30] Foreign Application Priority Data

Nov. 17, 1990 [JP] Japan .................. 2-312476

[51] Int. Cl.⁵ .................. B08B 3/08; B08B 15/00
[52] U.S. Cl. .................. 134/066; 134/133; 134/902; 454/57; 454/191
[58] Field of Search .................. 134/56 R, 57 R, 61, 134/66, 80, 133, 134, 902; 454/57, 188, 191, 193

[56] References Cited

U.S. PATENT DOCUMENTS

| | | | |
|---|---|---|---|
| 4,282,825 | 8/1981 | Nagatomo et al. | 134/902 X |
| 4,506,687 | 3/1985 | Rosch, III | 134/199 X |
| 4,696,226 | 9/1987 | Witmer | 454/191 X |
| 4,736,758 | 4/1988 | Kusuhara | 134/902 X |
| 4,823,680 | 4/1989 | Nowotarski | 454/188 |
| 5,099,751 | 3/1992 | Newman et al. | 454/191 X |

Primary Examiner—Philip R. Coe
Attorney, Agent, or Firm—Oblon, Spivak, McClelland, Maier & Neustadt

[57] ABSTRACT

A cleaning device in the present invention comprises cleaning chambers each for cleaning subjects to be cleaned, transport units for transporting the subjects, transport chambers each having one of the transport units, first decompression means for decompressing each of the transport chambers to keep its internal atmospheric pressure lower than the external atmospheric pressure of the cleaning device by 0 through 0.02 mmH₂O, and second decompression means for decompressing each of the cleaning chambers to keep its internal atmospheric pressure lower than the internal atmospheric pressure of each of the transport chambers by 0 through 0.02 mmH₂O.

9 Claims, 5 Drawing Sheets

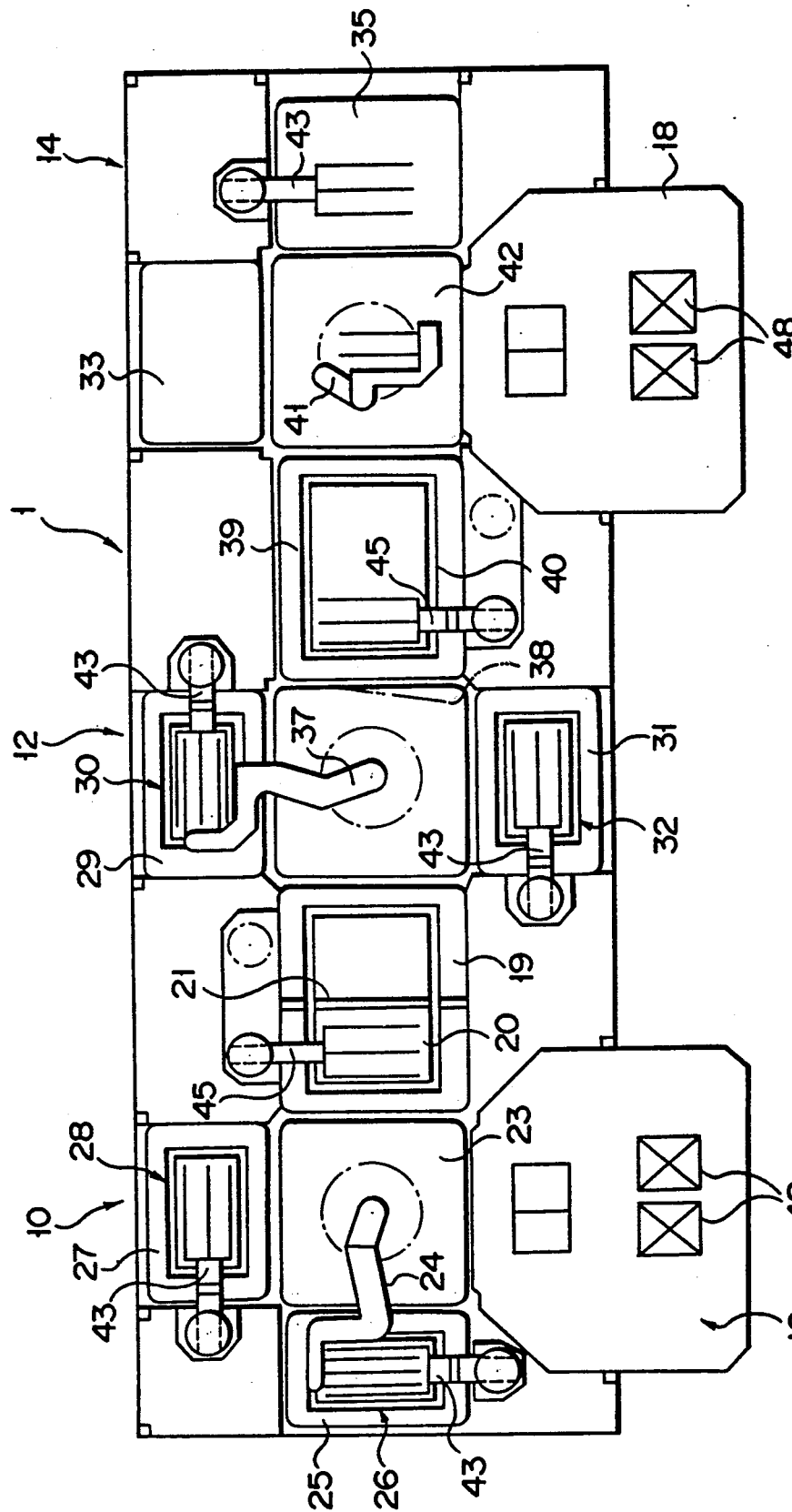
F I G. 1

CLEANING DEVICE

BACKGROUND OF THE INVENTION

1. Field of the Invention

The present invention relates to a cleaning device, especially to such a cleaning device that uses chemicals to perform its cleaning operation.

2. Description of the Related Art

A cleaning device for cleaning semiconductor wafers is known as one of the cleaning devices which use chemicals to perform their cleaning operation.

In the semiconductor wafer cleaning device, a semiconductor wafer is transported by a transport device to cleaning process tubs, such as an ammonia peroxide process tub, a peroxidized hydrochloric acid process tub, a washing process tub, a hydrofluoric acid process tub, etc., that are provided in the cleaning device and then is subjected to various cleaning processes, such as an ammonia peroxide process, a peroxidized hydrochloric acid process, a washing process, a hydrofluoric acid process, and so forth. The cleaning processes are performed by bringing the semiconductor wafer into contact with the processing liquids within each of the cleaning process tubs.

The cleaning process tubs are placed within their respective cases, which allow the tubs to receive within them any semiconductor wafer but prohibit any process liquids from scattering out of the cases. The entrance portion of each case through which a wafer passes can open and close, but the entrance is normally closed in an airtight manner, so that the processing atmosphere within the case will be maintained constant.

However, since the entrance portion of each of the cases is constructed to open and close for allowing a wafer to pass through the entrance, a gap will be present at the entrance portion. Therefore, there is a problem that the interior of each case cannot be maintained to be in a complete airtight condition, but the atmosphere within the case may leak through the gap toward the outside of the case.

When the internal atmosphere of each case leaks out, the following problem will occur. When alkaline and/or acid toxic chemicals such as ammonia and hydrochloric acid are used to perform any cleaning operation, an ammonia gas and/or a hydrochloric acid gas may escape from the respective cases, and they may adversely affect any semiconductor wafer which is subjected to a cleaning process outside the cases, or may contaminate the surrounding environment resulting in corrosion in any equipments, such as transport devices, etc., that are arranged in the cleaning device.

SUMMARY OF THE INVENTION

The object of the present invention is to provide a cleaning device which surely prevents the internal atmosphere of the cleaning chamber from leaking out of the chamber, so that the surrounding environment may not be contaminated, nor may the equipments arranged around the cleaning chamber be corroded.

The above object will be achieved by the cleaning device in the present invention which comprises cleaning chambers for cleaning subjects which are to be cleaned, transport means for transporting the subjects to each of the cleaning chambers, transport chambers each having one of the transport means, first decompressing means for decompressing the internal atmosphere of each transport chamber in such a manner that a differential pressure between the internal atmosphere of each transport chamber and the external atmosphere of the device will be kept at a range of 0 through 0.02 $mmH_2O$, and second decompressing means for decompressing the internal atmosphere of each cleaning chamber in such a manner that a differential pressure of 0 through 0.02 $mmH_2O$ will be kept between the internal atmosphere of each cleaning chamber and the internal atmosphere of each transport chamber.

The device in the present invention will surely prevent the internal atmosphere of any of the cleaning chambers from leaking out even if the external atmosphere may enter any of the cleaning chambers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a plan view showing an entire structure of a cleaning device in one embodiment of the present invention;

DETAILED DESCRIPTION OF THE PREFERRED EMBODIMENTS

Figure 2:
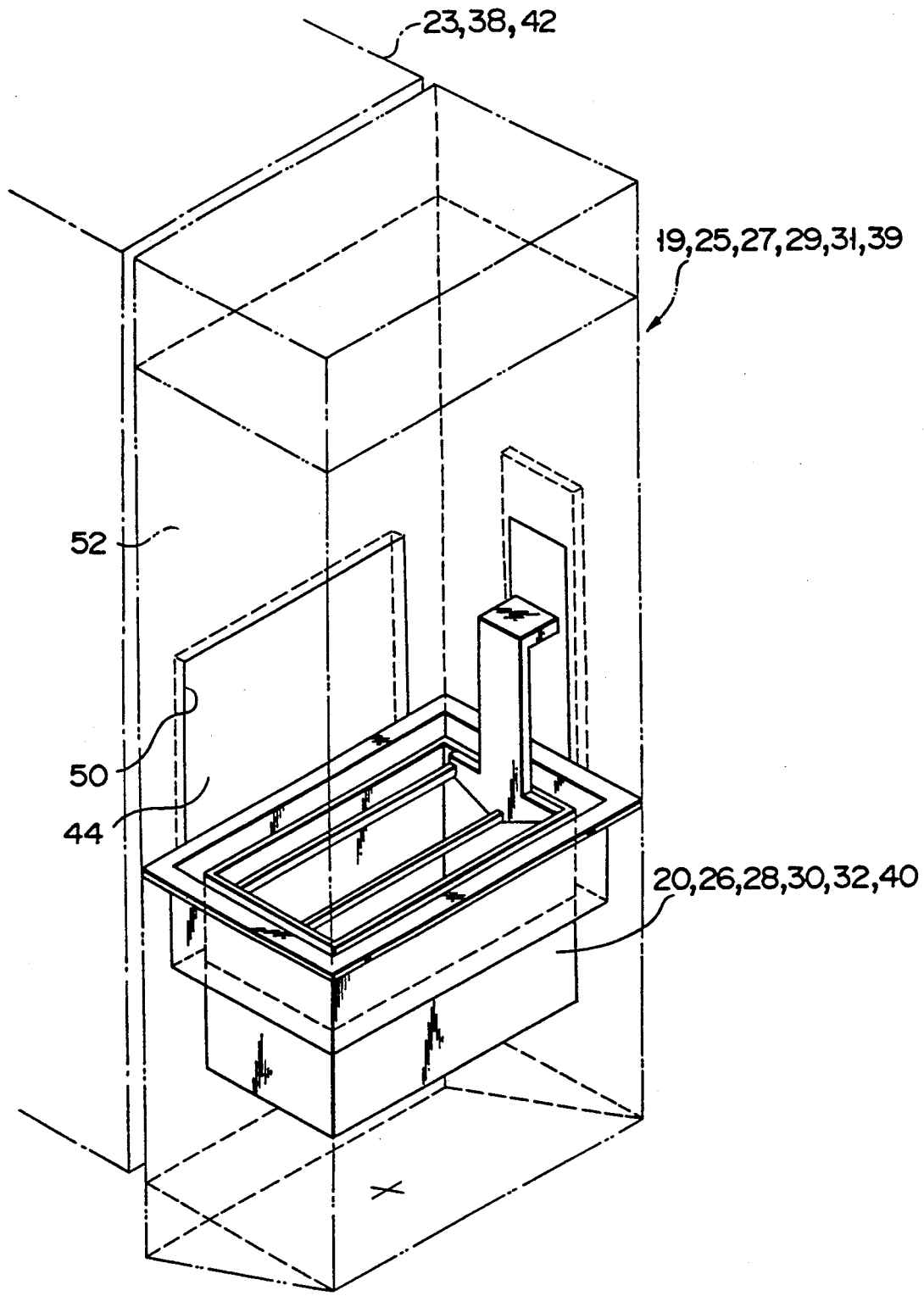
FIG. 2 is a perspective view briefly showing a structure of an interior of a representative of the cleaning chambers shown in FIG. 1.

Now, one embodiment of the present invention will be explained below with reference to the drawings.

As shown in FIG. 1, cleaning device 1 in one embodiment of the present invention consists of three cleaning process units 10, 12, and 14. Cleaning process unit 10 is arranged at an entrance side of cleaning device 1, in which semiconductor wafers to be cleaned are brought, and has entrance section 16 on which the brought semiconductor wafers are aligned in unit. Cleaning process unit 14 is arranged at an exit side of cleaning device 1, from which cleaned semiconductor wafers are forwarded, and has exit section 18 where cleaned semiconductor wafers are received in unit within a receptacle for transport.

Cleaning process unit 10 has at its central area a first transport chamber 23 which adjoins entrance section 16. First transport chamber 23 is surrounded with three cleaning chambers 19, 25 and 27. First transport chamber 23 is equipped with a first transport arm 24 which freely rotates to transport the aligned semiconductor wafers on entrance section 16 first to cleaning chamber 27, then to cleaning chamber 25, and finally to cleaning chamber 19.

Cleaning chamber 27 has a first chemical tub 28 which is filled with a chemical liquid mainly consisting of ammonia. Cleaning chamber 27 is located furthest away from entrance section 16 among three cleaning chambers 19, 25 and 27. Cleaning chamber 25 has a quick dump rinse (QDR) process tub 26 which allows coarse rinsing of the aligned wafers with water. Cleaning chamber 19 has processing tub 20 which water always overflows for performing a thorough rinse of the aligned wafers.

Central cleaning process unit 12 has second transport chamber 38, which adjoins cleaning chamber 19, and three cleaning chambers 29, 31, and 39 which are arranged around second transport chamber 38. Transport chamber 38 has inside of it second transport arm 37 which freely rotates to transport the aligned semiconductor wafers in cleaning chamber 19 first to cleaning chamber 29, then to cleaning chamber 31, and finally to cleaning chamber 39.

Cleaning chamber 29 has second chemical tub 30 which is filled with a chemical liquid mainly consisting of hydrochloric acid. Cleaning chamber 31 has quick dump rinse (QDR) process tub 32 which allows a coarse rinse of the aligned wafers with water. Cleaning chamber 39 has processing tub 40 which water always overflows for performing a thorough rinse of the aligned wafers.

Cleaning process unit 14 arranged at the exit side of cleaning device 1 has third transport chamber 42, which adjoins cleaning chamber 39, arm drying chamber 33, and semiconductor wafer drying chamber 35. Both arm drying chamber 33 and semiconductor wafer drying chamber 35 are arranged around third transport chamber 42. Third transport chamber 42 has inside of it third transport arm 41 which freely rotates to transport the aligned semiconductor wafers in cleaning chamber 39 to drying chamber 35. Drying chamber 33 is used for drying third transport arm 41 while the aligned wafers are being dried in drying chamber 35.

Note that cleaning chamber 19 is equipped with a partition plate 21 at its central region for preventing an ammonia gas which escapes from cleaning chamber 27 from reacting with a hydrochloric acid gas which escapes from cleaning chamber 29 to create a solid substance of ammonia chloride. Cleaning chambers 19, 25, 27, 29, 31, 39 and drying chamber 35 individually have receiving arm 43 or 45 for receiving the aligned semiconductor wafers from transport arm 24, 37 or 41. Cleaning chambers 19, 25, 27, 29, 31 and 39 are always supplied with fresh process liquids, and thus are always in an overflow condition.

Figure 3:
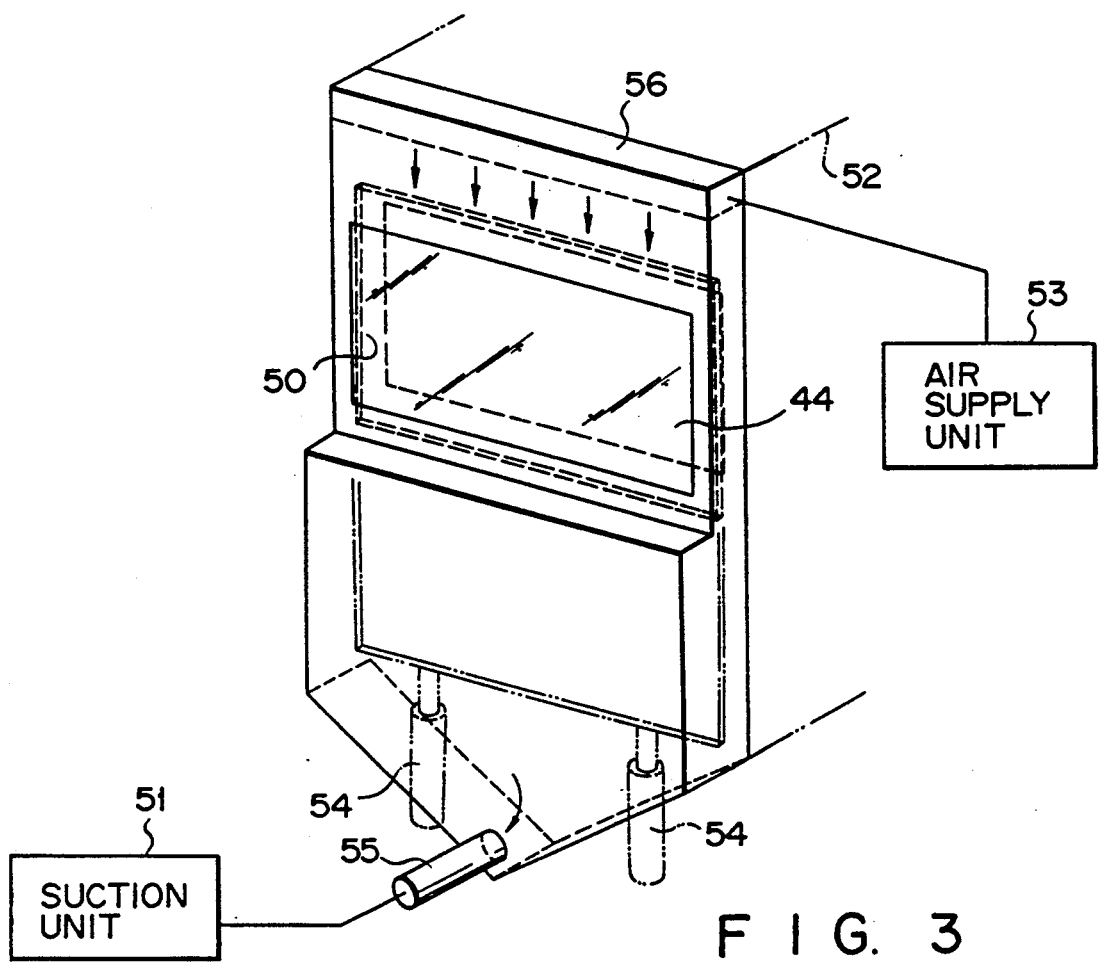
FIG. 3 is a perspective view showing a mechanical shutter and an air curtain, both provided at the opening of the representative of the cleaning chambers shown in FIG. 2.

Cleaning chambers 19, 25, 27, 29, 31 and 39 and drying chambers 33 and 35 have the same structure, and are each made of case 52 having opening 50 for the aligned semiconductor wafers to go in and out in unit, as shown in FIG. 2. Case 52 has a process tub 20, 26, 28, 30, 32, 40 inside of it in the instance of cleaning chambers 19, 25, 27, 29, 31 and 39. Opening 50 has mechanical shutter 44 which moves up and down by a cylinder 54 for mechanically opening and closing opening 50. As shown in FIG. 3, above opening 50 is provided air blowoff portion 56 which is connected with air supply unit 53. It is mechanical shutter 44 and an air curtain continuously blown out of air blowoff portion 56 that shield an internal atmosphere of case 52 from an external atmosphere of case 52. The air blown out of air blowoff portion 56 is forcibly sucked through suction pipe 55 by suction unit 51, so that the flowing rate of the air will be kept constant over the entire region of opening 50.

Figure 4:
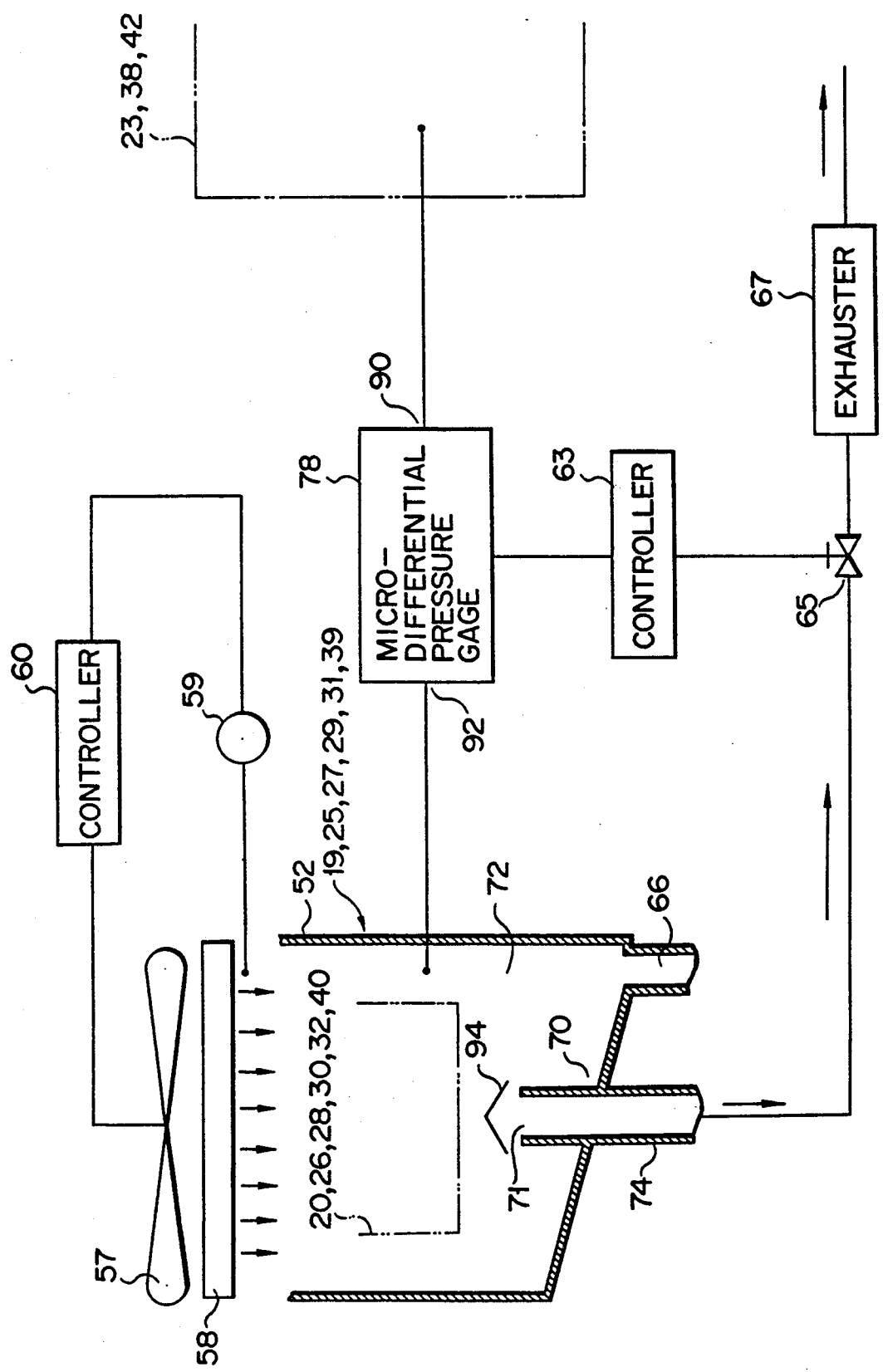
FIG. 4 is a circuit diagram showing a system for supplying and exhausting air into and out of each cleaning chamber.

Case 52 has, as shown in FIG. 4, drain 66 at its bottom through which any cleaning process liquids flowing over the process tubs 20, 26, 28, 30, 32, 40 in the case 52 will be discharged.

Case 52 is supplied with air which is sent through filter 58 by blower 57. The flowing rate of the air is measured by wind gage 59 and is controlled to be substantially constant by controller 60. The air supplied into case 52 is discharged through opening portion 70 provided at the bottom of case 52. The discharged amount of air is controlled to keep the inside of case 52 in such a decompressed condition that a micro-differential pressure between the internal atmosphere of case 52 and the external atmosphere of case 52 is in a range of 0 through 0.02 mmH$_2$O.

When the micro-differential pressure is smaller than 0.005 mmH$_2$O, the internal atmosphere tends to leak towards outside. In contrast, when the micro-differential pressure is larger than 0.01 mmH$_2$O, the air curtain usually breaks and the external atmosphere which includes many impurity particles tends to enter into case 52. Therefore, it is preferable that the micro-differential pressure is kept in a range of 0.005 through 0.01 mmH$_2$O.

Figure 6:
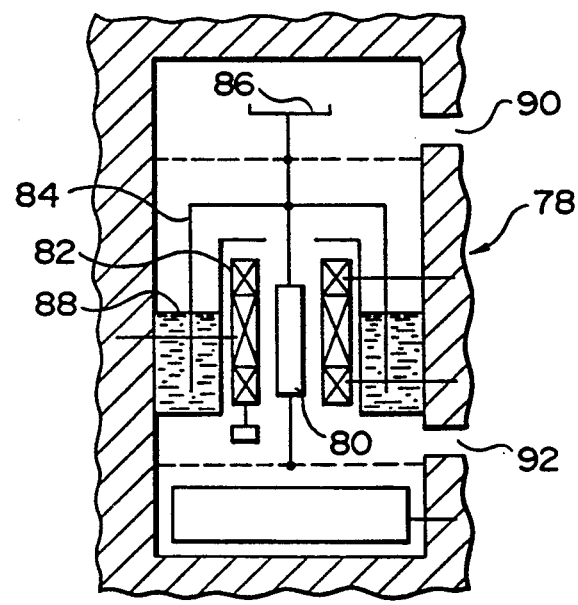
FIG. 6 is a sectional view showing on example of a micro-differential pressure gage.

In order to control the discharge/exhaust amount of the internal atmosphere, it is necessary to use micro-differential pressure gage 78 which achieves an accurate measurement of a slight pressure difference. A submerging weight type micro-differential pressure gage which is available from Shibata Kagaku Kikai Kohgyoh Kabushiki-gaisha is suitable, for instance. The submerging weight type micro-differential pressure gage has core 80, differential transformer 82 provided around core 80, submerging weight 84 attached to core 80, and weight saucer 86, as shown in FIG. 6. The lower part of submerging weight 84 is sealed with seal liquid 88. Micro-differential pressure gage 78 has high pressure introduction port 90 at its high pressure area located at its upper side and low pressure introduction port 92 at its lower pressure area located at a lower side, and it measures a slight difference in pressure between the high pressure area and the low pressure area.

Exhaust duct 74 is provided at opening portion 70 arranged at the bottom of case 52 in order to control the exhaust amount with the use of micro-differential pressure gage 78. There remains processing liquids in the bottom of case 52 without discharged, so that uppermost opening end 71 of exhaust duct 74 is situated higher than the highest level of the remained liquid surface. Exhaust duct 74 has at its intermediate portion valve 65 and exhauster 67 having a fan. Valve 65 is connected with controller 63 which varies an opening amount of valve 65. The air in case 52 is exhausted by exhauster 67 in accordance with the opening amount of valve 65 which is controlled by controller 63. Hood 94 is provided above uppermost opening end 71 of exhaust duct 74 to prevent any processing liquid from entering into exhaust duct 74.

Figure 5:
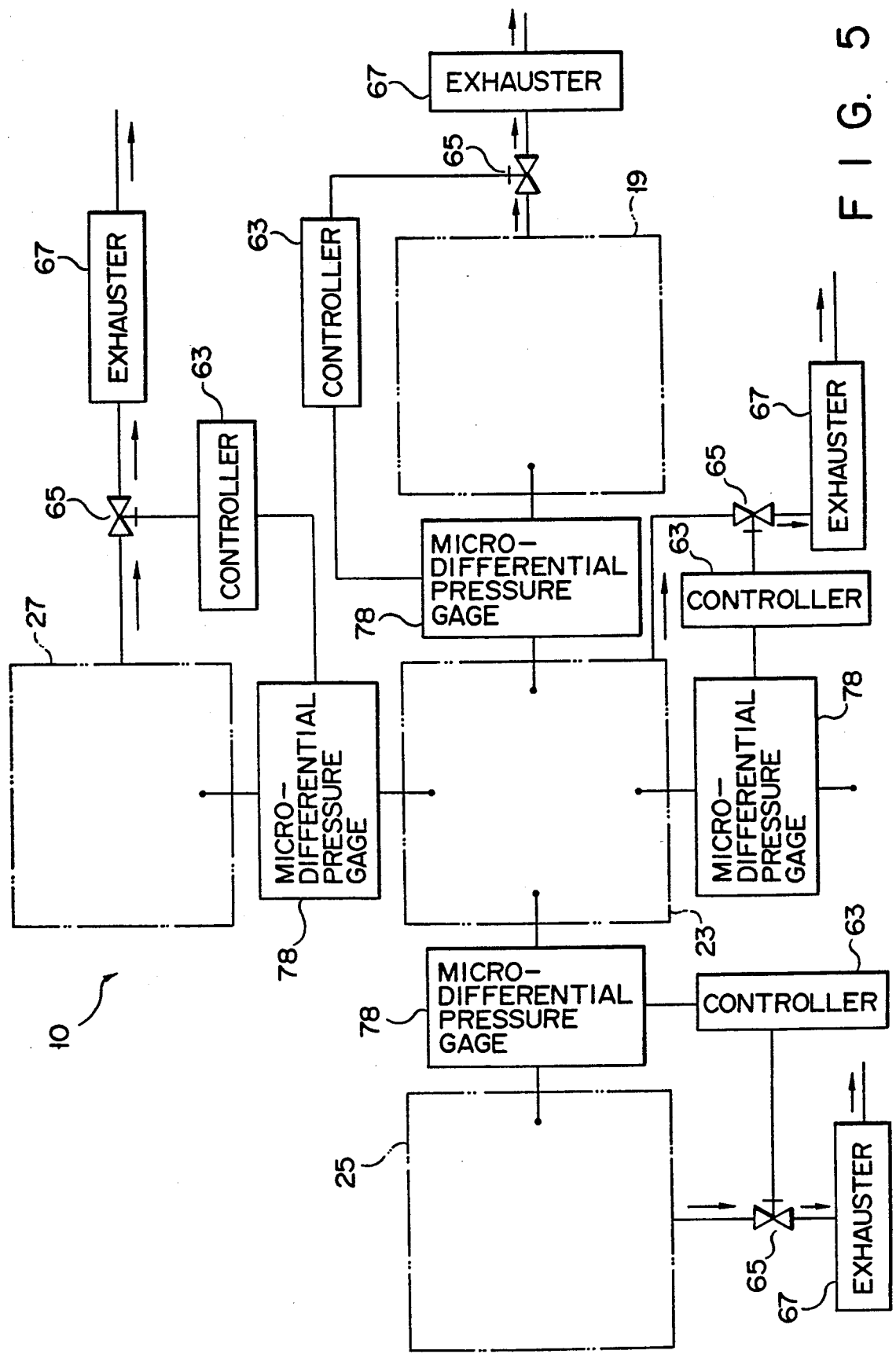
FIG. 5 is a circuit diagram showing a decompressing system.

Micro-differential pressure gage 78 is arranged in such a manner that its high pressure introduction port 90 is in communication with an exterior of case 52 and its low pressure introduction port 92 is in communication with an interior of case 52, due to which arrangement micro-differential pressure gage 78 can measure micro-differential pressure between the interior of case 52 and the exterior of case 52. Micro-differential pressure gage 78 is connected with controller 63 which changes the opening amount of valve 65 in accordance with the measured value of micro-differential pressure gage 78, so that the internal atmosphere of case 52, in which the aligned semiconductor wafers are cleaned, is kept to be in such a decompressed condition that the difference in pressure between the interior of case 52 and the exterior of case 52 is in a range of 0 through 0.02 mmH$_2$O. FIG. 5 shows how a plurality of micro-differential pressure gages 78 are arranged to control exhaust amount of each case 52, taking cleaning process unit 10 as an example. Since the other units are substantially the same in structure and function, no explanation will be given to the other units for refraining repetition. A total of four micro-differential pressure gages 78 are used in cleaning process unit 10, as shown in FIG. 5. Among them, one micro-differential pressure gage 78 is arranged such that its high pressure introduction port 90 is in communication with an exterior of cleaning process unit 10 and its low pressure introduction port 92 is in communication with an interior of first transport chamber 23 which is located inside cleaning process unit 10. The rest of micro-differential pressure gages 78 are arranged such that their high pressure introduction ports 90 are all in communication with first transport chamber 23 and their low pressure introduction ports 92 are in communication with their respective cleaning chambers 19, 25 and 27.

Now, the operation of cleaning device 1 having the above structure will be explained below.

Firstly, as shown in FIG. 1, two carriers 48 each carrying 25 semiconductor wafers are transported into entrance section 16. The 25 semiconductor wafers are aligned with their chord edge, having been sectioned along a straight line that joins two points on the circumference of each semiconductor wafer, being placed on a flat surface of a cassette at entrance section 16 by an orientation flat alignment mechanism. Then, the cassettes containing the wafers are set on a predetermined position.

First transport arm 24 turns, picks up the aligned semiconductor wafers out of the cassettes at entrance section 16, and transports them to cleaning chamber 27. Then, the mechanical shutter of cleaning chamber 27 (case 52) opens, and the semiconductor wafers enter through opening 50, which is shielded by the continuously flowing air curtain, into the inside of cleaning chamber 27. The entrance of the semiconductor wafers into each of cleaning chambers 19, 25, 27, 29, 31 and 39, and drying chamber 35 is performed in the same way. Receiving arm 43 receives the semiconductor wafers from first transport arm 24. The semiconductor wafers are subjected to an ammonia peroxide process in first chemical tub 28 while they are supported by receiving arm 43. Then, first transport arm 24 picks up the semiconductor wafers from receiving arm 43, and transports them to cleaning chamber 25, in which the semiconductor wafers are subjected to coarse rinsing. Then, the semiconductor wafers are subjected to intensive rinsing at cleaning chamber 19. After that, semiconductor wafers are transported to cleaning chamber 29 in processing unit 12 by second transport arm 37.

The semiconductor wafers having been subjected to peroxidized hydrochloric acid process are subjected to coarse rinsing at cleaning chamber 31 and intensive rinsing at cleaning chamber 40. After the intensive rinsing has been finished, the semiconductor wafers are transported to drying chamber 35 by third transport arm 41. While the semiconductor wafers are being dried, transport arm 41 is dried at drying chamber 33. The dried semiconductor wafers are transported to exit portion 18 by dried third transport arm 41.

The cleaning device 1 in the present invention surely prevents the internal atmosphere of each cleaning chamber from escaping outside each chamber, as explained above. Therefore, environmental pollution and corrosion of internal equipments will be prevented without fail.

The explanation on the cleaning of semiconductor wafers is given above as an applicable example of the present invention, but it is needless to say that the cleaning device in the present invention is also applicable to cleaning operation of LCD substrates or other substances.

The present invention is not limited to the above embodiment, but may be variously embodied without departing from the gist of the present invention.

What is claimed is:

1. A cleaning device comprising:
   a plurality of cleaning chambers each for cleaning objects to be cleaned and each having an opening for entrance and exit of the objects;
   air curtain generating means for shielding an internal atmosphere of each of the cleaning chambers from an external atmosphere of each of the cleaning chambers by an air curtain;
   mechanical shutters each provided at the opening of each cleaning chamber and capable of freely opening and closing for mechanically shielding the internal atmosphere of each cleaning chamber from the external atmosphere of each cleaning chamber;
   transport means each for carrying the objects to be cleaned into and out of some of the cleaning chambers while crossing the air curtain when the mechanical shutter is opened;
   transport chambers, each adjacent to some of the cleaning chambers and each having one of the transport means;
   first decompression means for decompressing an interior of each transport chamber to keep it lower in pressure than an exterior of the cleaning device for preventing an internal atmosphere of each transport chamber from escaping to the exterior of the cleaning device; and
   second decompression means for decompressing an interior of each cleaning chamber to keep it lower in pressure than the interior of each transport chamber for preventing an internal atmosphere of each cleaning chamber from escaping to the interior of each transport chamber.

2. The cleaning device according to claim 1, wherein one of the cleaning chambers is a first chemical chamber for treating the objects with acid chemicals, and another one of the cleaning chambers is a second chemical chamber for treating the objects with alkaline chemicals.

3. The cleaning device according to claim 2, further comprising shielding means arranged at one of the cleaning chambers, which is located between the first chemical chamber and the second chemical chamber, to prevent an occurrence of reaction between acid chemicals and alkaline chemicals.

4. The cleaning device according to claim 2, wherein the first chemical chamber and the second chemical chamber are both located further away from an entrance section or an exit section, through which the objects wafers enter or exit, in comparison with any other chambers.

5. The cleaning device according to claim 1, wherein the first decompression means has an air supply means for supplying air into each of the transport chambers and an exhaust means for exhausting air from each of the transport chambers, and the second decompression means has an air supply means for supplying air into each of the cleaning chambers and an exhaust means for exhausting air from each of the cleaning chambers.

6. The cleaning device according to claim 5, wherein each of the air supply means has an air supply control means to keep the supply amount of air constant.

7. The cleaning device according to claim 5, wherein the exhaust means of the first decompression means has an exhaust control means for keeping the internal atmospheric pressure of each of the transport chambers lower than the external atmospheric pressure of each of the transport chambers by a range of 0 through 0.02 mmH$_2$O, and the exhaust means of the second decompression means has an exhaust control means for keeping the internal atmospheric pressure of each of the cleaning chambers lower than the internal atmospheric pressure of each of the transport chambers by a range of 0 through 0.02 mmH$_2$O.

8. The cleaning device according to claim 1, wherein the air curtain generating means has an air supply means for supplying air and a suction means for sucking air.

9. The cleaning device according to claim 1, wherein the first decompression means and the second decompression means are constructed such that they generate a pressure difference of 0 through 0.02 mmH$_2$O.

* * * * *